(12) United States Patent
Tanimoto et al.

(10) Patent No.: US 8,513,118 B2
(45) Date of Patent: Aug. 20, 2013

(54) METHOD FOR PRODUCING COMPOUND SEMICONDUCTOR LIGHT-EMITTING DEVICE

(75) Inventors: Yoshimi Tanimoto, Osaka (JP); Takanori Sonoda, Osaka (JP)

(73) Assignee: Sharp Kabushiki Kaisha, Osaka-shi (JP)

(*) Notice: Subject to any disclaimer, the term of this patent is extended or adjusted under 35 U.S.C. 154(b) by 16 days.

(21) Appl. No.: 13/236,934

(22) Filed: Sep. 20, 2011

(65) Prior Publication Data

US 2012/0080712 A1  Apr. 5, 2012

(30) Foreign Application Priority Data

Sep. 30, 2010  (JP) ................................ 2010-220779

(51) Int. Cl.
*H01L 21/44* (2006.01)
*H01L 21/00* (2006.01)
*H01L 33/00* (2010.01)

(52) U.S. Cl.
USPC ............... 438/660; 438/22; 438/34; 438/608; 438/609; 257/98; 257/99

(58) Field of Classification Search
USPC .................. 438/660, 22, 34, 608; 257/98, 99
See application file for complete search history.

(56) References Cited

U.S. PATENT DOCUMENTS

| | | | |
|---|---|---|---|
| 6,316,343 B1* | 11/2001 | Wada et al. | 438/584 |
| 8,222,667 B2* | 7/2012 | Nakayama et al. | 257/99 |
| 2008/0299687 A1* | 12/2008 | Song et al. | 438/22 |
| 2009/0173962 A1 | 7/2009 | Hanawa et al. | |
| 2009/0179220 A1* | 7/2009 | Fukunaga et al. | 257/103 |

FOREIGN PATENT DOCUMENTS

JP    2007-287786    11/2007

* cited by examiner

*Primary Examiner* — Julio J Maldonado
*Assistant Examiner* — Cory Eskridge
(74) *Attorney, Agent, or Firm* — Morrison & Foerster LLP

(57) ABSTRACT

It is intended to provide a production method that enables at least one of improvement in transparency, reduction in sheet resistance, homogenization in planar distribution of sheet resistance, and reduction in contact resistance related to a contact layer regarding a transparent conductive oxide film included in a compound semiconductor light-emitting device. A method for producing a compound semiconductor light-emitting device includes depositing on a substrate a compound semiconductor stacked-layer body including a light-emitting layer, depositing a transparent conductive oxide film on the compound semiconductor stacked-layer body, and annealing the transparent conductive oxide film and thereafter cooling the same in a vacuum atmosphere.

10 Claims, 4 Drawing Sheets

METHOD FOR PRODUCING COMPOUND SEMICONDUCTOR LIGHT-EMITTING DEVICE

This nonprovisional application is based on Japanese Patent Application No. 2010-220779 filed on Sep. 30, 2010 with the Japan Patent Office, the entire contents of which are hereby incorporated by reference.

BACKGROUND OF THE INVENTION

1. Field of the Invention

The present invention is related to a method for producing a compound semiconductor light-emitting device and particularly to a production method that can improve at least one of transparency, sheet resistance, planar distribution of sheet resistance, and contact resistance regarding a transparent conductive oxide film included in a compound semiconductor light-emitting device.

2. Description of the Background Art

Compound semiconductor light-emitting devices that can emit the three primary color lights of red, green and blue are indispensable in order to utilize the light-emitting devices for various illumination uses. Regarding light-emitting diodes (LEDs), it has not been possible until recent years to utilize LEDs for various illumination uses because the blue LED among LEDs of the three primary colors has not been well-completed and not been available.

However, after the blue LED formed with nitride semiconductor has been developed in the 1990s, illumination products including LEDs are utilized not only for traffic signals but also for backlights in liquid crystal monitors, backlights in liquid crystal televisions and further various illumination uses at home.

Recently, liquid crystal televisions equipped with LED backlights begin to become widely used in a rapid pace in association with their price decline. In addition, illumination devices using LEDs have merits of enabling lower power consumption, smaller space occupied by them, and free of mercury preferably to the environment, as compared with the conventional illumination devices. After the summer of 2009, illumination devices using LEDs have been put on the market at much less prices as compared with those before and thus become popular in a very rapid pace.

In the meantime, light emitted from an illumination device, a backlight of a liquid crystal television, or the like should necessarily be white light. In general, white light obtainable using an LED can be realized by a combination of a blue LED and a yellow YAG (yttrium-aluminum-garnet) phosphor or a combination of a blue LED, a green phosphor and a red phosphor. In other words, a blue LED is needed in the case of obtaining white light utilizing an LED. For this reason, it is desired to provide a method that can produce bright blue LEDs in large amounts at low prices.

In general, III-V compound semiconductors containing nitrogen as a V-group element, such as gallium nitride (GaN), aluminum nitride (AlN), indium nitride (InN) and mixed crystals thereof are used for light-emitting layers included in LEDs and laser diodes (LDs) that can emit lights of shorter wavelengths such as blue and bluish green lights.

FIG. 6 shows a blue LED of a well-known double heterojunction type in a schematic cross-sectional view. In production of this blue LED, an Si-doped n-type GaN lower clad layer 102, an InGaN light-emitting layer 103, a Mg-doped p-type AlGaN upper clad layer 104, and a contact layer 105 are deposited in this order on a sapphire substrate 101. Deposited on contact layer 105 is a transparent conductive oxide film 108 on a partial area of which a p-side electrode 106 is provided. On the other hand, lower clad layer 102 is partly exposed by etching and then an n-side electrode 107 is provided on the exposed area.

When electric current is injected through p-side electrode 106 in the LED of FIG. 6, the current is dispersed in the planar direction of conductive oxide film 108. Then, the dispersed current is injected through contact layer 105 and upper clad layer 104 into a broad area of light-emitting layer 103 thereby causing light emission from the broad area of light-emitting layer 103.

Light emitted upward from light-emitting layer 103 is transmitted through upper clad layer 104, contact layer 105 and transparent conductive oxide film 108 and then taken out to the outside. By using a highly transparent material such as ITO (indium tin oxide) for transparent conductive oxide film 108, it becomes possible to reduce light loss when light emitted from light-emitting layer 103 is transmitted through transparent conductive oxide film 108. Further, since conductive oxide film 108 such as of ITO has lower resistance as compared with contact layer 105, diffusion of the injected current is enhanced to spread widely so as to increase light-emitting area of light-emitting layer 103 thereby improving the light-emitting efficiency of the device.

On the other hand, while conductive oxide film 108 has lower resistance as compared with contact layer 105, it exhibits a relatively high sheet resistance value in a range of $20\Omega/\square$ to $60\Omega/\square$. Further, the conductive oxide film tends to include relatively higher and lower sheet resistance areas in a mixed state depending on its partial areas. Therefore, the compound semiconductor light-emitting device including the transparent conductive oxide film has problems in which an operation voltage Vf thereof tends to become higher and light emission therefrom tends to become non-uniform depending on partial areas of the light-emitting layer.

In order to improve these problems, it is ideal to reduce the sheet resistance value of transparent conductive oxide film 108 to $20\Omega/\square$ or less and preferably to $10\Omega/\square$ or less. For the purpose of reducing the sheet resistance of the conductive oxide film, it is conceivably possible to improve the crystallinity of the conductive oxide film by annealing so as to reduce the sheet resistance of the conductive oxide film. However, there is a problem that a bonding state at an interface between conductive oxide film 108 and contact layer 105 is changed by the annealing to impair a stable bonding state such as of Ga—O, N—O, compounds of H, etc. at the interface, leading to higher contact resistance.

For the purpose of reducing the sheet resistance of the conductive oxide film, it is also conceivably possible to increase oxygen defect density in the crystal thereby increasing charge carrier density. However, the work function of the conductive oxide film is decreased as the carrier density is increased, whereby the electron potential is increased on the conductive oxide film side at the interface between conductive oxide film 108 and contact layer 105. For this reason, holes are poorly injected from the conductive oxide film to the contact layer, thereby causing a problem of increasing the contact resistance between conductive oxide film 108 and contact layer 105.

Under the circumstances, in the light-emitting device disclosed in Japanese Patent Laying-Open No. 2007-287786, it is attempted to reduce the sheet resistance of the transparent conductive oxide film with maintaining low contact resistance between the conductive oxide film and the contact layer by carrying out two-stage annealing including first annealing and second annealing. In the first annealing of Japanese Patent Laying-Open No. 2007-287786, the annealing is carried out at a temperature in a range of 250° C. to 600° C. in an atmosphere containing oxygen so as to reduce the contact resistance between the transparent conductive oxide film and the contact layer. Subsequently, in the second annealing, the annealing is carried out at a temperature in a range of 200° C. to 500° C. in an atmosphere free of oxygen (e.g., a $N_2$ gas atmosphere) so as to reduce the sheet resistance of the transparent conductive oxide film.

It is conventionally usual that an oxide film such as of ITO or IZO (indium zinc oxide) used for the transparent conductive oxide film is annealed in a $N_2$ gas atmosphere at the same pressure as the atmospheric pressure and then is cooled in the same $N_2$ gas atmosphere and then taken out from the furnace or cooled in a flow of an inert gas such as $N_2$ even in the case that the oxide film is annealed in a vacuum atmosphere. With this method, however, it is not possible to sufficiently reduce the sheet resistance of the transparent conductive oxide film, and there are caused problems of increase in operation voltage of the light-emitting device, non-uniform light emission in the surface of the light-emitting layer, and so forth.

SUMMARY OF THE INVENTION

In view of the problems as above, an object of the present invention is to provide a method for producing a compound semiconductor light-emitting device, which enables at least one of improvement in transparency, reduction in sheet resistance, homogenization in planar distribution of sheet resistance, and reduction in contact resistance related to a contact layer, regarding a transparent conductive oxide film included in the compound semiconductor light-emitting device.

As a result of various investigations, the present inventors have found that the oxide film such as of ITO or IZO used for the transparent conductive oxide film shows better homogeneity in planar distribution of sheet resistance in the case of having been cooled in a vacuum atmosphere rather than in a nitrogen atmosphere after annealing, though both the atmospheres are the same in terms of atmospheres free of oxygen.

A method for producing a compound semiconductor light-emitting device according to an aspect of the present invention includes depositing on a substrate a compound semiconductor stacked-layer body including a light-emitting layer, depositing a transparent conductive oxide film on the compound semiconductor stacked-layer body, and annealing the transparent conductive oxide film and then cooling the same in a vacuum atmosphere.

The annealing is preferably conducted in a gas atmosphere free of oxygen and may be carried out in a nitrogen gas atmosphere, in an argon gas atmosphere, or in a mixed gas atmosphere of nitrogen gas and argon gas. The annealing may also be carried out in a vacuum atmosphere.

A method for producing a compound semiconductor light-emitting device according to another aspect of the present invention includes depositing on a substrate a compound semiconductor stacked-layer body including a light-emitting layer, depositing a transparent conductive oxide film on the compound semiconductor stacked-layer body, and subjecting the transparent conductive oxide film to first annealing in an atmosphere containing oxygen and then to second annealing in an atmosphere free of oxygen and thereafter cooling the same in a vacuum atmosphere.

The second annealing is preferably conducted in a gas atmosphere free of oxygen and may be carried out in a nitrogen gas atmosphere, in an argon gas atmosphere, or in a mixed gas atmosphere of nitrogen gas and argon gas. The second annealing may also be carried out in a vacuum atmosphere.

In the method for producing a compound semiconductor light-emitting device according to either of the aspects of the present invention, pressure in the vacuum atmosphere is preferably 10 Pa or less. The cooling in the vacuum atmosphere is preferably continued to a temperature of 200° C. or less. The transparent conductive oxide film is preferably formed of an oxide including indium and may be formed of ITO or IZO. The transparent conductive oxide film preferably has a thickness in a range of 100 nm to 400 nm.

With the production method as described above, it becomes possible to provide a compound semiconductor light-emitting device having various improved characteristics.

More specifically, according to the present invention, it becomes possible to realize at least one of improvement in transparency, reduction in sheet resistance, homogenization in planar distribution of sheet resistance, and reduction in contact resistance related to a contact layer, regarding a transparent conductive oxide film included in a compound semiconductor light-emitting device and then it becomes possible to obtain a compound semiconductor light-emitting device that has a reduced operation voltage and can provide uniform light emission.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

<Compound Semiconductor Light-Emitting Device>

Figure 1:
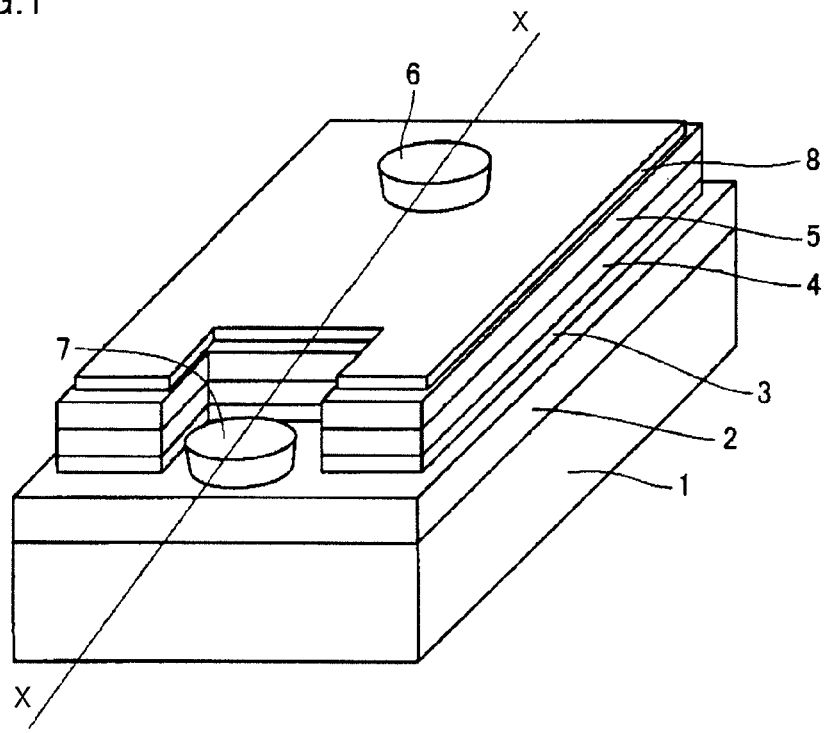
FIG. 1 is a schematic perspective view showing an example of a compound semiconductor light-emitting device that can be made by a method of the present invention.
Figure 2:
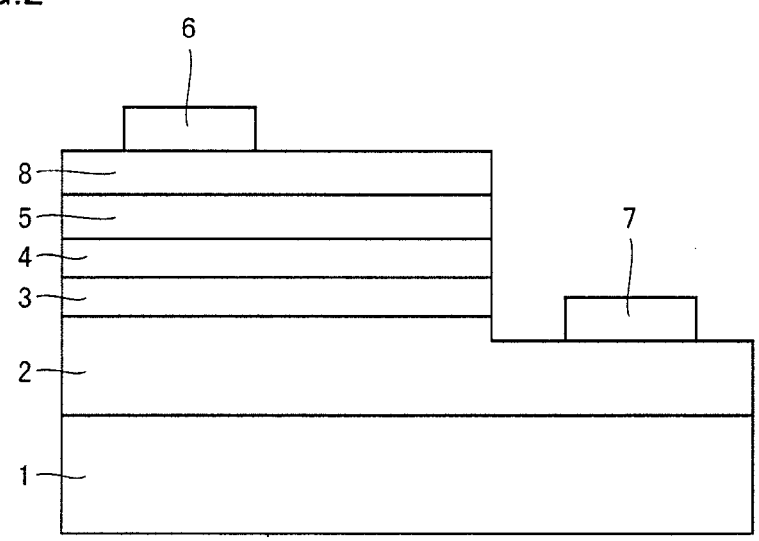
FIG. 2 is a schematic cross-sectional view taken along a line X-X shown in FIG. 1.

FIG. 1 shows in a schematic perspective view an example of a compound semiconductor light-emitting device that can be produced by a method of the present invention, and FIG. 2 is a cross-sectional view taken along a line X-X shown in FIG. 1. In the drawings of the present application, the dimensional relations such as length, width and thickness are arbitrarily changed for clarity of the drawings and thus do not show the actual dimensional relations.

In the compound semiconductor light-emitting device, a lower clad layer 2, a light-emitting layer 3, an upper clad layer 4, and a contact layer 5 are deposited in this order on a substrate 1. Formed on contact layer 5 is a transparent conductive oxide film 8, on a partial area of which a first electrode 6 is provided. On the other hand, a part of lower clad layer 2 is exposed by etching and then a second electrode 7 is provided on the exposed area.

Here, a double hetero junction is formed with lower clad layer 2, light-emitting layer 3 and upper clad layer 4. For light-emitting layer 3, it is possible to select a compound semiconductor of being undoped, an n-type, a p-type, or containing impurities for both the n-type and p-type, as desired. A p-n junction is formed between lower clad layer 2 and upper clad layer 4 with light-emitting layer 3 therebetween.

<Lower Clad Layer>

In the light of technical meaning of the double hetero junction structure, each of the clad layers has a greater bandgap as compared with the light-emitting layer and has a function of holding electrons and holes within the light-emitting layer by a potential barrier due to the gap difference. However, lower clad layer 2 in FIG. 1 and FIG. 2 may also include a buffer layer between substrate 1 and light-emitting layer 3 as well as a contact layer for good ohmic contact with n-side electrode 7. Such lower clad layer 2 can be formed as a multiple layer including not only a nitride semiconductor layer doped with n-type impurities but also undoped nitride semiconductor layer, for example. More specifically, lower clad layer 2 can include a low temperature buffer layer, an AlN buffer layer, an undoped layer, a doped layer of an n-type, an n-type contact layer, and so forth, for example.

As described above, while lower clad layer 2 may be formed as a single layer or a multiple layer functioning as a clad layer, GaN, AlGaN, InAlGaN, or InGaN can be used in the case of the single layer and may contain Si or may be undoped. Further, in the case of lower clad layer 2 being formed as a multiple layer, it may have a stacked-layer structure of InGaN/GaN, InGaN/AlGaN, AlGaN/GaN, InGaN/InGaN, or the like and may have a periodic multilayer structure including a plurality of layers stacked repeatedly. Further, such a multiple layer structure may be formed as a super lattice structure.

<Light-Emitting Layer>

Light-emitting layer 3 is preferably formed by alternately stacking GaN barrier layers and well layers of nitride semiconductor containing In. While preferable thickness of the well layer depends on wavelength of light to be emitted, it is preferably in a range of 2 to 20 nm. Such light-emitting layer 3 is not restricted to have a quantum well structure but may have any of a single well structure, a multiple well structure, a multiple quantum well structure, and the like. In the case that light-emitting layer 3 includes a plurality of well layers, it is only necessary that at least one well layer accomplishes the light-emitting function. Such a well layer is preferably formed with $In_pGa_{1-p}N$ (0<p<1), for example.

<Upper Clad Layer>

As described above, in the light of technical meaning of the double hetero junction structure, each of the clad layers has a greater bandgap as compared with the light-emitting layer and has a function of holding electrons and holes within the light-emitting layer by a potential barrier due to the gap difference. However, upper clad layer 4 in FIG. 1 and FIG. 2 may also include an evaporation-prevention layer, a carrier-blocking layer and a p-type layer serving as a current diffusion layer. In other words, upper clad layer 4 can be a single layer or a multiple layer. Any of GaN, AlGaN, InAlGaN, and InGaN that are undoped or doped with p-type impurities can be used for the single layer. In the case of upper clad layer 4 being formed as a multiple layer, it may have a stacked-layer structure of InGaN/GaN, InGaN/AlGaN, AlGaN/GaN, InGaN/InGaN, or the like and may have a periodic multilayer structure including a plurality of layers stacked repeatedly. Further, such a multilayer structure may be formed as a super lattice structure.

Such an upper clad layer preferably has a thickness of 500 nm or less. The reason for this is that if upper clad layer having a thickness more than 500 nm is deposited by vapor phase deposition, light-emitting layer 3 is subjected to heat for a long time and then non-light-emitting partial areas on light-emitting layer 3 are increased due to thermal degradation. In the meantime, it is preferable to provide an evaporation-prevention layer in contact with light-emitting layer 3 in order to prevent In contained in the light-emitting layer from evaporating. The evaporation-prevention layer can be included in upper clad layer 4, as described above.

<Contact Layer>

Contact layer 5 is provided so as to reduce the contact resistance with transparent conductive oxide film 8. Such contact layer 5 is preferably of nitride semiconductor doped with a higher concentration of p-type impurities as compared with upper clad layer 4. It should be noted that transparent conductive oxide film 8 may be formed on upper clad layer 4 without providing contact layer 5. In this case, it is preferable to increase the concentration of p-type impurities in the vicinity of the upper surface of upper clad layer 4.

<First Electrode and Second Electrode>

First electrode 6 and second electrode 7 serve as bases for wire-bonding for electrically connecting with an outer circuit. First electrode 6 and second electrode 7 can be formed in a known aspect by utilizing materials of Ti, Al, Au, etc. Each of first electrode 6 and second electrode 7 is not restricted to be a single layer and can be formed with a multilayer structure. In the case of each of first electrode 6 and second electrode 7 having a multilayer structure, the uppermost layer is preferably formed as an Au layer having a thickness of about 500 nm. This makes it possible to secure stability of wire-bonding with an outer circuit when the compound semiconductor light-emitting device is mounted on a package.

In the meantime, part of light emission from light-emitting layer 3 is emitted toward the side of upper clad layer 4. Therefore, first electrode 6 is an electrode positioned in a direction in which light emitted from light-emitting layer 3 is taken out of the side of upper clad layer 4. On the other hand, second electrode 7 in FIG. 1 and FIG. 2 is shown on an exemplary position in the case of substrate 1 being formed of an insulative material. Specifically, second electrode 7 is provided on an exposed partial area of lower clad layer 2 in the case of substrate 1 being formed of an insulative material. In the case of substrate 1 being formed of a conductive material, however, second electrode 7 can be formed on the bottom surface of substrate 1.

<Transparent Conductive Oxide Film>

Transparent conductive oxide film 8 is provided so as to transmit light emitted from light-emitting layer 3 and so as to make a contact with contact layer 5 whereby diffusing current to the entire surface thereof and thus increasing the light-emitting area of light-emitting layer 3 below. Therefore, it is preferable to use a material having lower resistance for transparent conductive oxide film 8 as compared with contact layer 5. This makes it possible that current injected from first electrode 6 is diffused in the planar direction of transparent conductive oxide film 8. Such conductive oxide film 8 can preferably be formed by utilizing materials of ITO, IZO, etc. and it is particularly preferable to use ITO. The reason for this is that ITO is particularly excellent from the viewpoint of the transparency and the contact resistance.

Transparent conductive oxide film 8 preferably has a thickness in a range of 100 nm to 400 nm. The reason for this is that if transparent conductive oxide film 8 has a thickness less than 100 nm, the high sheet resistance thereof causes increase of operation voltage of the light-emitting device and if it has a thickness greater than 400 nm, the transparency thereof is decreased and then light extraction efficiency of the light-emitting device is decreased.

<Method for Producing Compound Semiconductor Light-Emitting Device>

In a method for producing a compound semiconductor light-emitting device according an embodiment of the present invention, semiconductor layers 2 to 5 of compound semiconductor such as III-group nitride semiconductor are deposited in this order on substrate 1. Transparent conductive oxide film 8 is then deposited on contact layer 5 and this conductive oxide film 8 is subjected to first annealing in an atmosphere containing oxygen and subsequently to second annealing in an atmosphere free of oxygen and then subjected to cooling in vacuum.

The oxide such as ITO or IZO used for the transparent conductive oxide film is conventionally subjected to annealing in a $N_2$ atmosphere at the same pressure as the atmospheric pressure and directly cooled in the same $N_2$ atmosphere and then taken out from the furnace. However, this conventional method does not make it possible to sufficiently reduce the sheet resistance of the conductive oxide film and causes increase of operation voltage of the light-emitting device and non-uniform light emission in the light-emitting layer.

The method of the present invention can improve those conventional problems and bring about at least one of improvement in transparency, reduction in contact resistance related to contact layer 5, and improvement in planar uniformity of sheet resistance regarding transparent conductive oxide film 8 by cooling the oxide film in vacuum after annealing. Each step of the method for producing the compound semiconductor light-emitting device will be explained in more detail in the following.

<Deposition of Compound Semiconductor Layers>

The temperature of substrate 1 is first adjusted to 1050° C. for example in an MOCVD (metal organic chemical vapor deposition) apparatus and then lower clad layer 2 is crystal-grown on substrate 1 by introducing a III-group element source gas with a carrier gas containing nitrogen and hydrogen, a doping gas containing Si, and ammonia gas into the apparatus.

Here, as the III-group element source gas to be introduced into the MOCVD apparatus for growing lower clad layer 2, it is possible to use TMG (($CH_3$)$_3$Ga:trimethylgallium), TEG (($CH_2$)$_5$Ga:triethylgallium), TMA (($CH_3$)$_3$Al:trimethylaluminum), TEA (($CH_2$)$_5$Al:triethylaluminum), TMI (($CH_3$)$_3$In:trimethylindium), or TEI (($CH_2$)$_5$In:triethylindium), for example. Further, it is possible to use $SiH_4$ (silane) for example as the doping gas.

Subsequently, light-emitting layer 3 is formed by alternately depositing well layers containing In and barrier layers on lower clad layer 2. Further, upper clad layer 4 is formed on light-emitting layer 3. At this time, the substrate temperature is adjusted to a temperature suitable for crystal-growing upper clad layer 4. Then, upper clad layer 4 is crystal-grown on light-emitting layer 3 by introducing a carrier gas containing nitrogen and hydrogen, a III-group element source gas, a doping gas containing Mg, and ammonia gas into the MOCVD apparatus. Subsequently, contact layer 5 is formed on upper clad layer 4.

Specifically, in the case that upper clad layer 4 is to be formed with GaN or AlGaN, the substrate temperature suitable for crystal-growing upper clad layer 4 is preferably in a range of 950° C. to 1300° C. and more preferably in a range of 1000° C. to 1150° C. By crystal-growing upper clad layer 4 at such a substrate temperature, it is possible to improve crystallinity of upper clad layer 4.

As the doping gas containing Mg, it is possible to use $Cp_2Mg$ (biscyclopentadienyl magnesium) or $(EtCp)_2Mg$ (ethyl biscyclopentadienyl magnesium), for example. Incidentally, as compared with $Cp_2Mg$ being in a solid state under conditions of a room temperature and an atmospheric pressure, $(EtCp)_2Mg$ being in a liquid state under the same conditions has better responsiveness to change in flow rate into the MOCVD apparatus and thus the vapor pressure thereof can be readily maintained to be constant.

As the III-group element source gas and ammonia gas used for forming upper clad layer 4, it is possible to utilize the some kinds of gases as those used in the case of forming lower clad layer 2 and light-emitting layer 3. By the processes as above, it is possible to form a compound semiconductor stacked-layer body including lower clad layer 2, light-emitting layer 3, upper clad layer 4, and contact layer 5.

<Deposition of Transparent Conductive Oxide Film>

Transparent conductive oxide film 8 is deposited on contact layer 5 by using an electron beam evaporation method or a sputtering evaporation method. Incidentally, it is possible to deposit transparent conductive oxide film 8 directly on upper clad layer 4 without contact layer 5 therebetween. In the case of depositing transparent conductive oxide film 8 by a sputtering evaporation method, transparent conductive oxide film 8 is formed by introducing a target and a sputtering gas into a sputtering chamber in which sputtering power is then applied.

<First Annealing>

Transparent conductive oxide film 8 deposited as described above is subjected to first annealing in an atmosphere containing oxygen. By carrying out the annealing in such an atmosphere containing oxygen, it is possible to crystallize the material constituting transparent conductive oxide film 8, improve the transparency, and reduce the contact resistance related to contact layer 5. Namely, the annealing in an atmosphere containing oxygen can improve the cystallinity of transparent conductive layer 8 and reduce the sheet resistance of conductive oxide film 8.

In the meantime, it is preferable to carry out the first annealing at a temperature in a range of 450° C. to 700° C. This makes it possible to enhance the effect of reducing the sheet resistance of conductive oxide film 8. Further, the first annealing is conducted preferably for a time in a range of 3 minutes to 30 minutes and more preferably for a time of 20 minutes or less.

<Second Annealing>

After the first annealing, transparent conductive oxide film 8 is subjected to second annealing at an atmosphere free of oxygen. The most important feature of the present invention resides in that cooling is carried out in vacuum after the second annealing.

The annealing in an atmosphere free of oxygen can reduce the sheet resistance of the transparent conductive oxide film without degrading the transparency thereof. Further, it is possible by cooling in vacuum to homogenize the planar distribution of sheet resistance in the transparent conductive oxide film.

The second annealing is conducted preferably in a vacuum atmosphere, a nitrogen atmosphere, an argon atmosphere, or a mixed atmosphere of nitrogen and argon, and most preferably in the vacuum atmosphere. The vacuum atmosphere during the cooling means an atmosphere of a pressure significantly reduced as compared to an atmospheric pressure and its pressure is preferably 10 Pa or less. Further, it is preferable to continue the vacuum cooling to a temperature of 200° C. or less.

Figure 3:
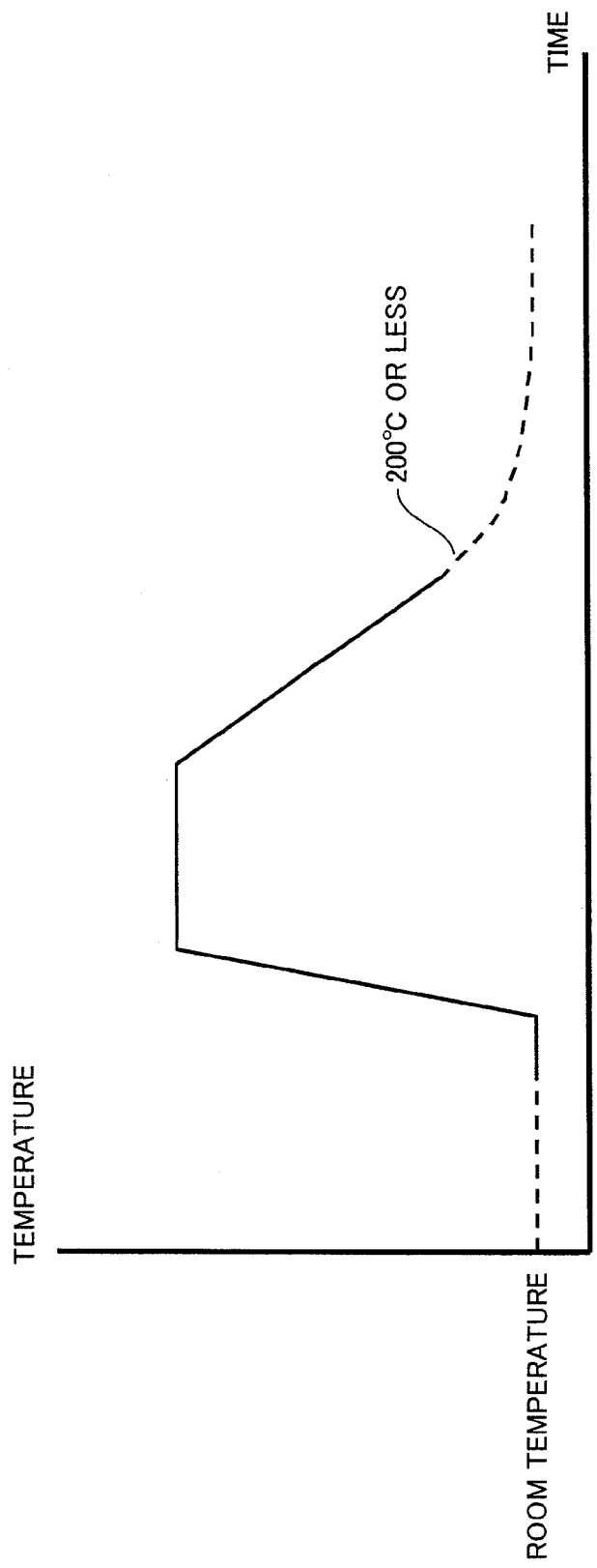
FIG. 3 is a schematic graph showing an example of a temperature profile during annealing of a transparent conductive oxide film and during cooling thereafter.

A graph of FIG. 3 exemplarily and schematically shows a temperature profile during the second annealing and cooling thereafter. In this graph, therefore, the vertical axis represents the temperature in an annealing furnace and the horizontal axis represents the time. Further, the solid line in the graph represents the vacuum state in the furnace and the broken line represents the state of an atmospheric pressure in the furnace.

With the second annealing conducted in a vacuum atmosphere, it is possible to form oxygen defects in the crystal of the transparent conductive oxide film so as to increase the carrier density and then reduce the sheet resistance of the conductive oxide film. Furthermore, by cooling in the vacuum atmosphere of the same pressure as that during the annealing, it is possible to improve the uniformity of planar distribution of sheet resistance in the conductive oxide film.

Figure 4:
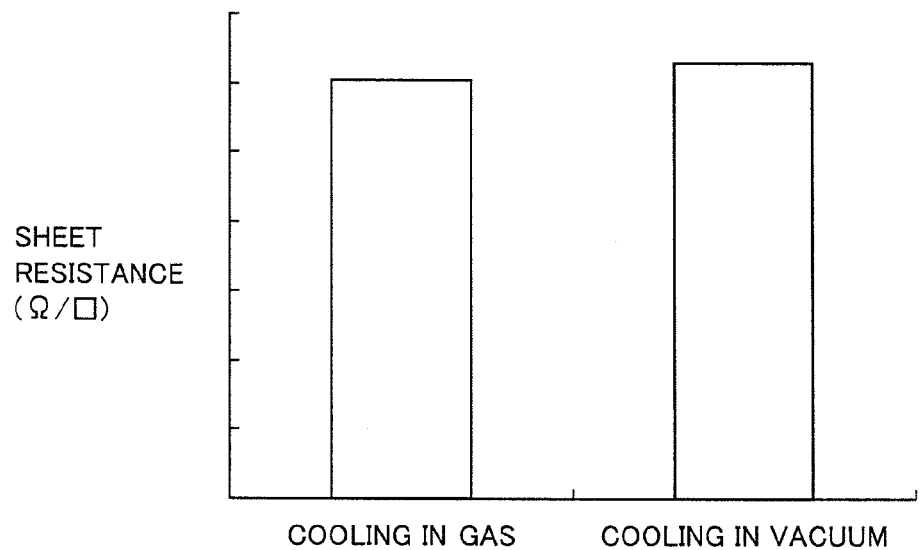
FIG. 4 is a histogram showing a comparison between averaged sheet resistance values of transparent conductive oxide films in the cases of having been cooled in a gas atmosphere and in a vacuum atmosphere after annealing.

A histogram of FIG. 4 shows a comparison between averaged sheet resistance values of the conductive oxide films in the cases of having been cooled in gas and in vacuum after the second annealing. In this graph, the vertical axis represents the relative sheet resistance ($\Omega$/□), the left side bar shows the sheet resistance in the case of cooling in a gas, and the right side bar shows the sheet resistance in the case of cooling in vacuum. From the result of FIG. 4, it is understood that the difference between the cooling in gas and the cooling in vacuum does not exert significant influence on the averaged sheet resistance value of the conductive oxide film.

In the meantime, it is preferable to conduct the second annealing at a temperature not higher than the temperature of the first annealing. Further, the second annealing is preferably conducted for a time in a range of one minute to 30 minutes. With the second annealing, it is possible to obtain a sheet resistance value of 10$\Omega$/□ or less in transparent conductive oxide film 8 without deterioration of the transparency and increase of the contact resistance related to contact layer 5.

Figure 5:
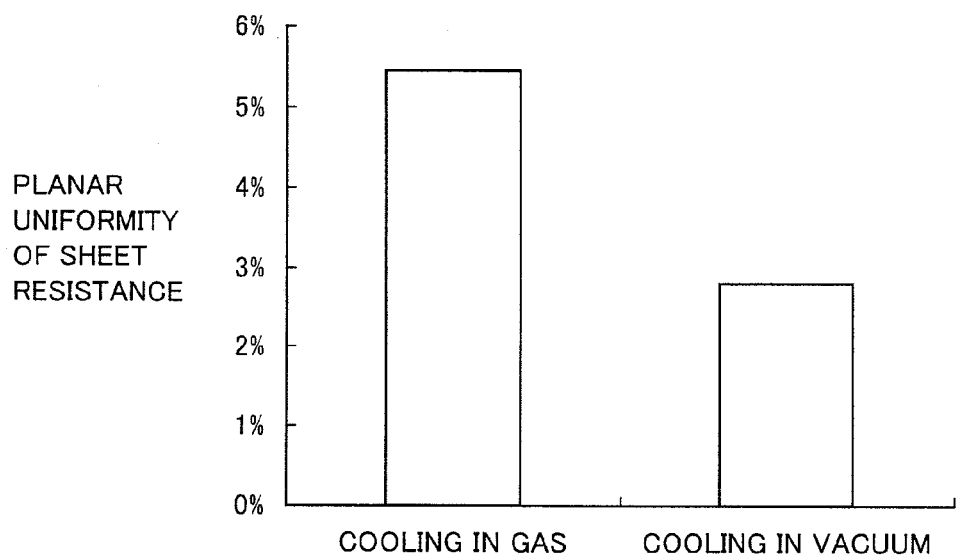
FIG. 5 is a histogram showing a comparison between degrees of planar uniformity of sheet resistance in transparent conductive oxide films in the cases of having been cooled in a gas atmosphere and in a vacuum atmosphere after annealing.
Figure 6:
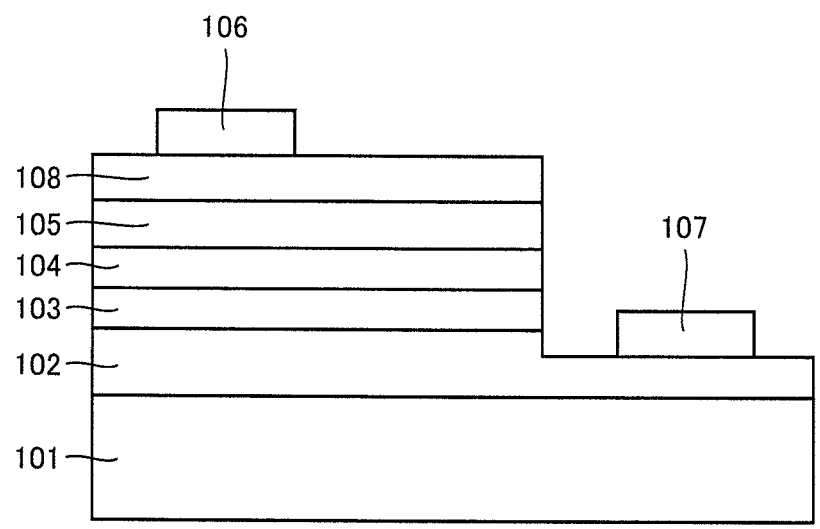
FIG. 6 is a schematic cross-sectional view showing an example of a blue LED of a well-known double hetero junction type.

A histogram of FIG. 5 shows a comparison between degrees of planar uniformity of sheet resistance in the transparent conductive oxide films in the cases of having been cooled in gas and in vacuum after the second annealing. As shown in FIG. 5, while variation of the sheet resistance in the plane of the conductive oxide film having been cooled in gas is about 5%, variation of the sheet resistance in the plane of the conductive oxide film having been cooled in vacuum is about a half and specifically about 2% whereby better planar uniformity of the sheet resistance is obtained.

The reason for this can be considered as follows. At the time just after beginning of the cooling after the annealing, the conductive oxide film still remains at a high temperature enough to generate oxygen defects. In the case of cooling in gas in such a state, it is considered that a temperature distribution is caused by the cooling gas. Therefore, it is then considered that oxygen defects are further generated in some portions in the conductive oxide film and the other portions are cooled without further generation of oxygen defects, whereby degrading the planar uniformity of the sheet resistance. In the case of cooling in vacuum after the annealing, on the other hand, it is considered that since the temperature distribution due to the cooling gas does not happen, the entire conductive oxide film is uniformly cooled and thus variation in the planar distribution of the sheet resistance becomes small.

Incidentally, the averaged sheet resistance value in FIG. 4 was obtained as an arithmetic mean value calculated from values measured by a four-terminal method at 73 points on the conductive oxide film. Further, the planar uniformity degree of the sheet resistance in FIG. 5 was calculated by dividing the difference between the maximum and minimum sheet resistance values at the 73 points by the double of the averaged sheet resistance value.

<Formation of First and Second Electrodes>

First electrode 6 and second electrode 7 described above can be formed by utilizing known photolithography, known electron beam evaporation, a known lift-off process, and so forth.

Although the embodiments of the present invention have been described and illustrated in detail, it is also intended to select and combine the various technical matters disclosed in the embodiments. Further, it should be understood that the embodiments are by way of illustrations and examples only and are not to be taken by way of limitations, the scope of the present invention being interpreted by the terms of the appended claims, and it is intended that the present invention includes all the variations within the meaning and scope equivalent to the scope of the claims.

The production method of the present invention can improve at least one of the transparency, sheet resistance, planar distribution of sheet resistance, and contact resistance of a transparent conductive oxide film included in a compound semiconductor light-emitting device, and then such an improved compound semiconductor light-emitting device can preferably be utilized in LED illumination, backlight of a liquid TV, and so forth.

What is claimed is:

1. A method for producing a compound semiconductor light-emitting device, comprising:
    depositing on a substrate a compound semiconductor stacked-layer body including a light-emitting layer;
    depositing a transparent conductive oxide film on the compound semiconductor stacked-layer body;
    subjecting the transparent conductive oxide film to first annealing in a gaseous atmosphere containing oxygen;
    subjecting, after the first annealing, the transparent conductive oxide film to second annealing in a vacuum atmosphere or in a gaseous atmosphere free of oxygen; and
    cooling, after the second annealing, the transparent conductive oxide film in a vacuum atmosphere.

2. The method according to claim 1 wherein pressure in the vacuum atmosphere during the annealing is 10 Pa or less.

3. The method according to claim 1 wherein the cooling in the vacuum atmosphere is continued to a temperature of 200° C. or less.

4. The method according to claim 1 wherein the transparent conductive oxide film is formed of an oxide including indium.

5. The method according to claim 4 wherein the transparent conductive oxide film is formed of ITO or IZO.

6. The method according to claim 1 wherein the transparent conductive oxide film has a thickness in a range of 100 nm to 400 nm.

7. The method according to claim 1 wherein the second annealing is carried out only in the gaseous atmosphere free of oxygen.

8. The method according to claim 7 wherein the second annealing is carried out in a nitrogen gas atmosphere, in an argon gas atmosphere, or in a mixed gas atmosphere of nitrogen gas and argon gas.

9. The method according to claim 1 wherein the second annealing is carried out only in the vacuum atmosphere.

10. A compound semiconductor light-emitting device produced by the following process steps:

depositing on a substrate a compound semiconductor stacked-layer body including a light-emitting layer;

depositing a transparent conductive oxide film on the compound semiconductor stacked-layer body;

subjecting the transparent conductive oxide film to first annealing in a gaseous atmosphere containing oxygen;

subjecting, after the first annealing, the transparent conductive oxide film to second annealing in a vacuum or in a gaseous atmosphere free of oxygen; and cooling, after the second annealing, the transparent conductive in a vacuum atmosphere, wherein a planar distribution of a sheet resistance of the transparent conductive oxide film is more homogenized than a planar distribution of a sheet resistance of a transparent conductive oxide film that is not cooled in the vacuum atmosphere.

\* \* \* \* \*